US011294008B2

(12) United States Patent
Alford (10) Patent No.: US 11,294,008 B2
(45) Date of Patent: Apr. 5, 2022

(54) MAGNETIC FIELD MEASUREMENT SYSTEM WITH AMPLITUDE-SELECTIVE MAGNETIC SHIELD

(71) Applicant: HI LLC, Los Angeles, CA (US)

(72) Inventor: Jamu Alford, Simi Valley, CA (US)

(73) Assignee: HI LLC, Los Angeles, CA (US)

( * ) Notice: Subject to any disclaimer, the term of this patent is extended or adjusted under 35 U.S.C. 154(b) by 312 days.

(21) Appl. No.: 16/741,593

(22) Filed: Jan. 13, 2020

(65) Prior Publication Data

US 2020/0241094 A1 Jul. 30, 2020

Related U.S. Application Data

(60) Provisional application No. 62/827,390, filed on Apr. 1, 2019, provisional application No. 62/796,958, filed on Jan. 25, 2019.

(51) Int. Cl.
*G01R 33/42* (2006.01)
*G01R 33/26* (2006.01)

(52) U.S. Cl.
CPC .............. *G01R 33/42* (2013.01); *G01R 33/26* (2013.01)

(58) Field of Classification Search
CPC ................ G01R 33/00; G01R 33/0035; G01R 33/0023; G01R 33/0017; G01R 31/3191; G01R 33/42; G01R 33/26; G01B 7/004; G01C 17/38; G06F 3/017; G06F 3/0346; G06F 3/012
See application file for complete search history.

(56) References Cited

U.S. PATENT DOCUMENTS

| 3,173,082 A | 3/1965 | Bell et al. |
| 3,257,608 A | 6/1966 | Bell et al. |
| 3,495,161 A | 2/1970 | Bell |
| 3,501,689 A | 3/1970 | Robbiano |

(Continued)

FOREIGN PATENT DOCUMENTS

| CN | 104730484 | 6/2015 |
| CN | 106073751 | 11/2016 |

(Continued)

OTHER PUBLICATIONS

Arjen Stolk, Ana Todorovic, Jan-Mathijs Schoffelen, and Robert Oostenveld. "Online and offline tools for head movement compensation in MEG." Neuroimage 68 (2013): 39-48.

(Continued)

*Primary Examiner* — Jermele M Hollington
*Assistant Examiner* — Taqi R Nasir
(74) *Attorney, Agent, or Firm* — Branch Partners PLLC; Bruce E. Black (57) ABSTRACT

A magnetic field measurement system for measurement of weak magnetic field signals or a wearable assembly includes at least one magnetometer and a shield disposed around the magnetometer. The shield includes a first portion configured for positioning between the at least one magnetometer and a source of the weak magnetic field signals. The first portion is made of an amplitude-selective magnetic shield (ASMS) that preferentially passes magnetic fields having a magnetic field amplitude below a threshold (for example, 500 nT or less) and shields magnetic fields having a larger magnetic field amplitude.

20 Claims, 5 Drawing Sheets

(56) References Cited

U.S. PATENT DOCUMENTS

| | | | |
|---|---|---|---|
| 3,513,381 A | 5/1970 | Happer, Jr. | |
| 4,193,029 A | 3/1980 | Cioccio et al. | |
| 4,951,674 A | 8/1990 | Zanakis et al. | |
| 5,189,368 A | 2/1993 | Chase | |
| 5,192,921 A | 3/1993 | Chantry et al. | |
| 5,225,778 A | 7/1993 | Chaillout et al. | |
| 5,254,947 A | 10/1993 | Chaillout et al. | |
| 5,309,095 A | 5/1994 | Ahonen et al. | |
| 5,442,289 A | 8/1995 | DiIorio et al. | |
| 5,444,372 A | 8/1995 | Wikswo, Jr. et al. | |
| 5,471,985 A | 12/1995 | Warden | |
| 5,506,200 A | 4/1996 | Hirschkoff et al. | |
| 5,526,811 A | 6/1996 | Lypchuk | |
| 5,713,354 A | 2/1998 | Warden | |
| 6,144,872 A | 11/2000 | Graetz | |
| 6,242,908 B1 * | 6/2001 | Scheller | G01D 3/02 324/207.12 |
| 6,339,328 B1 | 1/2002 | Keene et al. | |
| 6,472,869 B1 | 10/2002 | Upschulte et al. | |
| 6,665,553 B2 | 12/2003 | Kandori et al. | |
| 6,806,784 B2 | 10/2004 | Hollberg et al. | |
| 6,831,522 B2 | 12/2004 | Kitching et al. | |
| 7,038,450 B2 | 5/2006 | Romalis et al. | |
| 7,102,451 B2 | 9/2006 | Happer et al. | |
| 7,145,333 B2 | 12/2006 | Romalis et al. | |
| 7,521,928 B2 | 4/2009 | Romalis et al. | |
| 7,656,154 B2 | 2/2010 | Kawabata et al. | |
| 7,826,065 B1 | 11/2010 | Okandan et al. | |
| 7,872,473 B2 | 1/2011 | Kitching et al. | |
| 7,994,783 B2 | 8/2011 | Ledbetter et al. | |
| 8,054,074 B2 | 11/2011 | Ichihara et al. | |
| 8,212,556 B1 | 7/2012 | Schwindt et al. | |
| 8,258,884 B2 | 9/2012 | Borwick, III et al. | |
| 8,319,156 B2 | 11/2012 | Borwick, III et al. | |
| 8,334,690 B2 | 12/2012 | Kitching et al. | |
| 8,373,413 B2 | 2/2013 | Sugioka | |
| 8,405,389 B2 | 3/2013 | Sugioka et al. | |
| 8,587,304 B2 | 11/2013 | Budker et al. | |
| 8,836,327 B2 | 9/2014 | French et al. | |
| 8,906,470 B2 | 12/2014 | Overstolz et al. | |
| 8,941,377 B2 | 1/2015 | Mizutani et al. | |
| 9,084,549 B2 | 7/2015 | Desain et al. | |
| 9,095,266 B1 | 8/2015 | Fu | |
| 9,116,201 B2 | 8/2015 | Shah et al. | |
| 9,140,590 B2 | 9/2015 | Waters et al. | |
| 9,140,657 B2 | 9/2015 | Ledbetter et al. | |
| 9,169,974 B2 | 10/2015 | Parsa et al. | |
| 9,244,137 B2 | 1/2016 | Kobayashi et al. | |
| 9,291,508 B1 | 3/2016 | Biedermann et al. | |
| 9,343,447 B2 | 3/2016 | Parsa et al. | |
| 9,366,735 B2 | 6/2016 | Kawabata et al. | |
| 9,383,419 B2 | 7/2016 | Mizutani et al. | |
| 9,395,425 B2 | 7/2016 | Diamond et al. | |
| 9,417,293 B2 | 8/2016 | Schaffer et al. | |
| 9,429,918 B2 | 8/2016 | Parsa et al. | |
| 9,568,565 B2 | 2/2017 | Parsa et al. | |
| 9,575,144 B2 | 2/2017 | Kornack et al. | |
| 9,601,225 B2 | 3/2017 | Parsa et al. | |
| 9,638,768 B2 | 5/2017 | Foley et al. | |
| 9,639,062 B2 | 5/2017 | Dyer et al. | |
| 9,677,905 B2 | 6/2017 | Waters et al. | |
| 9,726,626 B2 | 8/2017 | Smith et al. | |
| 9,726,733 B2 | 8/2017 | Smith et al. | |
| 9,791,536 B1 | 10/2017 | Alem et al. | |
| 9,829,544 B2 | 11/2017 | Bulatowicz | |
| 9,846,054 B2 | 12/2017 | Waters et al. | |
| 9,851,418 B2 | 12/2017 | Wolf et al. | |
| 9,869,731 B1 | 1/2018 | Hovde et al. | |
| 9,915,711 B2 | 3/2018 | Kornack et al. | |
| 9,927,501 B2 | 3/2018 | Kim et al. | |
| 9,948,314 B2 | 4/2018 | Dyer et al. | |
| 9,964,609 B2 | 5/2018 | Ichihara et al. | |
| 9,964,610 B2 | 5/2018 | Shah et al. | |
| 9,970,999 B2 | 5/2018 | Larsen et al. | |
| 9,995,800 B1 | 6/2018 | Schwindt et al. | |
| 10,024,929 B2 | 7/2018 | Parsa et al. | |
| 10,088,535 B1 | 10/2018 | Shah | |
| 10,162,016 B2 | 12/2018 | Gabrys et al. | |
| 10,194,865 B2 | 2/2019 | Le et al. | |
| 10,314,508 B2 | 6/2019 | Desain et al. | |
| 10,371,764 B2 | 8/2019 | Morales et al. | |
| 10,772,561 B2 | 9/2020 | Donaldson | |
| 2004/0232912 A1 | 11/2004 | Tsukamoto et al. | |
| 2005/0007118 A1 | 1/2005 | Kitching et al. | |
| 2005/0046851 A1 | 3/2005 | Riley, Jr. et al. | |
| 2005/0206377 A1 | 9/2005 | Romalis et al. | |
| 2007/0076776 A1 | 4/2007 | Lust et al. | |
| 2007/0120563 A1 | 5/2007 | Kawabata et al. | |
| 2007/0167723 A1 | 7/2007 | Park et al. | |
| 2007/0205767 A1 | 9/2007 | Xu et al. | |
| 2009/0079426 A1 | 3/2009 | Anderson | |
| 2009/0101806 A1 | 4/2009 | Masuda | |
| 2010/0219820 A1 | 9/2010 | Skidmore et al. | |
| 2011/0062956 A1 | 3/2011 | Edelstein et al. | |
| 2012/0112749 A1 | 5/2012 | Budker et al. | |
| 2013/0082700 A1 | 4/2013 | Mizutani et al. | |
| 2013/0082701 A1 | 4/2013 | Mizutani et al. | |
| 2013/0265042 A1 | 10/2013 | Kawabata et al. | |
| 2014/0121491 A1 | 5/2014 | Zhang | |
| 2014/0306700 A1 | 10/2014 | Kamada et al. | |
| 2014/0354275 A1 | 12/2014 | Sheng et al. | |
| 2015/0022200 A1 | 1/2015 | Ichihara et al. | |
| 2015/0054504 A1 | 2/2015 | Ichihara et al. | |
| 2015/0378316 A1 | 12/2015 | Parsa et al. | |
| 2016/0061913 A1 | 3/2016 | Kobayashi et al. | |
| 2016/0116553 A1 | 4/2016 | Kim et al. | |
| 2016/0174862 A1 * | 6/2016 | Yu | A61B 5/245 600/409 |
| 2016/0223627 A1 | 8/2016 | Shah et al. | |
| 2016/0291099 A1 * | 10/2016 | Ueno | A61B 5/055 |
| 2016/0313417 A1 | 10/2016 | Kawabata et al. | |
| 2017/0023653 A1 | 1/2017 | Kobayashi et al. | |
| 2017/0023654 A1 | 1/2017 | Kobayashi et al. | |
| 2017/0067969 A1 | 3/2017 | Butters et al. | |
| 2017/0199138 A1 | 7/2017 | Parsa et al. | |
| 2017/0199251 A1 | 7/2017 | Fujii et al. | |
| 2017/0261564 A1 | 9/2017 | Gabrys et al. | |
| 2017/0331485 A1 | 11/2017 | Gobet et al. | |
| 2017/0343617 A1 | 11/2017 | Manickam et al. | |
| 2017/0343695 A1 | 11/2017 | Stetson et al. | |
| 2017/0356969 A1 | 12/2017 | Ueno | |
| 2017/0360322 A1 | 12/2017 | Ueno | |
| 2017/0363695 A1 | 12/2017 | Ueno | |
| 2018/0003777 A1 | 1/2018 | Sorensen et al. | |
| 2018/0038921 A1 | 2/2018 | Parsa et al. | |
| 2018/0100749 A1 | 4/2018 | Waters et al. | |
| 2018/0128885 A1 | 5/2018 | Parsa et al. | |
| 2018/0156875 A1 | 6/2018 | Herbsommer et al. | |
| 2018/0219353 A1 | 8/2018 | Shah | |
| 2018/0238974 A1 | 8/2018 | Shah et al. | |
| 2018/0313908 A1 | 11/2018 | Knappe et al. | |
| 2018/0313913 A1 | 11/2018 | DeNatale et al. | |
| 2018/0372813 A1 | 12/2018 | Bulatowicz et al. | |
| 2019/0391213 A1 | 12/2019 | Alford | |
| 2020/0025844 A1 | 1/2020 | Alford et al. | |
| 2020/0056263 A1 | 2/2020 | Bhattacharyya et al. | |
| 2020/0057115 A1 | 2/2020 | Jiménez-Marténez et al. | |
| 2020/0057116 A1 | 2/2020 | Zorzos et al. | |
| 2020/0064421 A1 | 2/2020 | Kobayashi et al. | |
| 2020/0072916 A1 | 3/2020 | Alford et al. | |
| 2020/0088811 A1 | 3/2020 | Mohseni | |
| 2020/0109481 A1 | 4/2020 | Sobek et al. | |
| 2020/0241094 A1 | 7/2020 | Alford | |
| 2020/0256929 A1 | 8/2020 | Ledbetter et al. | |
| 2020/0309873 A1 | 10/2020 | Ledbetter et al. | |
| 2020/0334559 A1 | 10/2020 | Anderson et al. | |
| 2020/0341081 A1 | 10/2020 | Mohseni et al. | |
| 2020/0381128 A1 | 12/2020 | Pratt et al. | |

(56) References Cited

U.S. PATENT DOCUMENTS

2020/0400763 A1    12/2020   Pratt
2021/0063510 A1     3/2021   Ledbetter

FOREIGN PATENT DOCUMENTS

| | | |
|---|---|---|
| CN | 107562188 | 1/2018 |
| EP | 2738627 A3 | 6/2014 |
| EP | 2380029 B1 | 10/2015 |
| EP | 3037836 B1 | 9/2017 |
| JP | 2012100839 | 5/2012 |
| JP | 2016109665 | 6/2016 |
| JP | 2018004462 | 1/2018 |
| WO | 2005/081794 | 9/2005 |
| WO | 2014/031985 | 2/2014 |
| WO | 2017/095998 | 6/2017 |

OTHER PUBLICATIONS

Bagherzadeh, Yasaman, Daniel Baldauf, Dimitrios Pantazis, and Robert Desimone. "Alpha synchrony and the neurofeedback control of spatial attention." Neuron 105, No. 3 (2020): 577-587.

Allred, J. C., Lyman, R. N., Kornack, T. W., & Romalis, M. V. (2002). High-sensitivity atomic magnetometer unaffected by spin-exchange relaxation. Physical review letters, 89(13), 130801.

Balabas et al. Polarized alkali vapor with minute-long transverse spin-relaxation time, Phys. Rev. Lett. 105, 070801—Published Aug. 12, 2010.

Barbieri, F., Trauchessec, V., Caruso, L., Trejo-Rosillo, J., Telenczuk, B., Paul, E., . . . & Ouanounou, G. (2016). Local recording of biological magnetic fields using Giant Magneto Resistance-based micro-probes. Scientific reports, 6, 39330.

Dmitry Budker and Michael Romalis, "Optical Magnetometry," Nature Physics, 2008, https://arxiv.org/abs/physics/0611246v1.

Anthony P. Colombo, Tony R. Carter, Amir Borna, Yuan-Yu Jau, Cort N. Johnson, Amber L. Dagel, and Peter D. D. Schwindt, "Four-channel optically pumped atomic magnetometer for magnetoencephalography," Opt. Express 24, 15403-15416 (2016).

Dang, H.B. & Maloof, A.C. & Romalis, Michael. (2009). Ultra-high sensitivity magnetic field and magnetization measurements with an atomic magnetometer. Applied Physics Letters. 97. 10.1063/1.3491215.

Donley, E.A. & Hodby, E & Hollberg, L & Kitching, J. (2007). Demonstration of high-performance compact magnetic shields for chip-scale atomic devices. The Review of scientific instruments. 78. 083102.

Hämäläinen, Matti & Hari, Riitta & Ilmoniemi, Risto J. & Knuutila, Jukka & Lounasmaa, Olli V. Apr. 1993. Magnetoencephalograph—theory, instrumentation, and applications to noninvasive studies of the working human brain. Reviews of Modern Physics. vol. 65, Issue 2. 413-497.

Hunter, D. and Piccolomo, S. and Pritchard, J. D. and Brockie, N. L. and Dyer, T. E. and Riis, E. (2018) Free-induction-decay magnetometer based on a microfabricated Cs vapor cell. Physical Review Applied (10).ISSN 2331-7019.

Jiménez-Martínez, R., Griffith, W. C., Wang, Y. J., Knappe, S., Kitching, J., Smith, K., & Prouty, M. D. (2010). Sensitivity comparison of Mx and frequency-modulated bell-bloom Cs magnetometers in a microfabricated cell. IEEE Transactions on Instrumentation and Measurement, 59(2), 372-378.

Kiwoong Kim, Samo Begus, Hui Xia, Seung-Kyun Lee, Vojko Jazbinsek, Zvonko Trontelj, Michael V. Romalis, Multi-channel atomic magnetometer for magnetoencephalography: A configuration study. NeuroImage 89 (2014) 143-151 http://physics.princeton.edu/romalis/papers/Kim_2014.pdf.

Knappe, Svenja & Sander, Tilmann & Trahms, Lutz. (2012), Optically-Pumped Magnetometers for MEG. Magnetoencephalography: From Signals to Dynamic Cortical Networks. 993-999. 10.1007/978-3-642-33045-2_49.

Kominis, I.K., Kornack, T.W., Allred, J.C, and Romalis, M.V., 2003. A subfemtotesla multichannel atomic magnetometer. Nature, 422(6932), p. 596.

Korth, H., K. Strohbehn, F. Tejada, A. G. Andreou, J. Kitching, S. Knappe, S. J. Lehtonen, S. M. London, and M. Kafel (2016), Miniature atomic scalarmagnetometer for space based on the rubidium isotope 87Rb, J. Geophys. Res. Space Physics, 121, 7870-7880, doi: 10.1002/2016JA022389.

Lenz, J. and Edelstein, S., 2006. Magnetic sensors and their applications. IEEE Sensors journal, 6(3), pp. 631-649.

Li, S & Vachaspati, Pranjal & Sheng, Dehong & Dural, Nezih & Romalis, Michael. (2011). Optical rotation in excess of 100 rad generated by Rb vapor in a multipass cell. Phys. Rev. A. 84. 10.1103/PhysRevA.84.061403.

Maze, J. R., Stanwix, P. L., Hodges, J. S., Hong, S., Taylor, J. M., Cappellaro, P., . . . & Yacoby, A. (2008). Nanoscale magnetic sensing with an individual electronic spin in diamond. Nature, 455(7213), 644.

Sander TH, Preusser J, Mhaskar R, Kitching J, Trahms L, Knappe S. Magnetoencephalography with a chip-scale atomic magnetometer. Biomed Opt Express. 2012;3(5):981-90.

J. Seltzer, S & Romalis, Michael. (2010). High-temperature alkali vapor ceils with antirelaxation surface coatings. Journal of Applied Physics. 106.114905-114905. 10.1063/1.3236649.

Seltzer, S. J., and Romalis, M.V., "Unshielded three-axis vector operation of a spin-exchange-relaxation-free atomic magnetometer." Applied physics letters 85.20 (2004): 4804-4806.

Sheng, Dong & R. Perry, Abigail & Krzyzewski, Sean & Geller, Shawn & Kitching, John & Knappe, Svenja. (2017). A microfabricated optically-pumped magnetic gradiometer. Applied Physics Letters. 110. 10.1063/1.4974349.

Sheng, Dehong & Li, S & Dural, Nezih & Romalis, Michael. (2013). Subfemtotesla Scalar Atomic Magnetometry Using Multipass Cells. Physical review letters. 110. 160802. 10.1103/PhysRevLett.110.160802.

Volkmar Schultze et al. An Optically Pumped Magnetometer Working in the Light-Shift Dispersed Mz Mode, Sensors 2017, 17, 561; doi:10.3390/s17030561.

Fang, J. and Qin, J., 2012. In situ triaxial magnetic field compensation for the spin-exchange-relaxation-free atomic magnetometer. Review of Scientific Instruments, 83(10), p. 103104.

Joon Lee, Hyun & Shim, Jeong & Moon, Han Seb & Kim, Kiwoong. (2014). Flat-response spin-exchange relaxation free atomic magnetometer under negative feedback. Optics Express. 22. 10.1364/OE.22.019887.

Griffith, Clark & Jimenez-Martinez, Ricardo & Shah, Vishal & Knappe, Svenja & Kitching, John. (2009). Miniature atomic magnetometer integrated with flux concentrators. Applied Physics Letters—Appl Phys Lett. 94. 10.1063/1.3056152.

Lee, S.-K & Romalis, Michael. (2008). Calculation of Magnetic Field Noise from High-Permeability Magnetic Shields and Conducting Objects with Simple Geometry. Journal of Applied Physics. 103. 084904-084904. 10.1063/1.2885711.

Vovrosh, Jamie & Voulazeris, Georgios & Petrov, Plamen & Zou, Ji & Gaber Beshay, Youssef & Benn, Laura & Woolger, David & Attallah, Moataz & Boyer, Vincent & Bongs, Kai & Holynski, Michael. (2018). Additive manufacturing of magnetic shielding and ultra-high vacuum flange for cold atom sensors. Scientific Reports. 8. 10.1038/s41598-018-20352-x.

Kim, Young Jin & Savukov, I. (2016). Ultra-sensitive Magnetic Microscopy with an Optically Pumped Magnetometer, Scientific Reports. 6. 24773. 10.1038/srep24773.

Navau, Carles & Prat-Camps, Jordi & Sanchez, Alvaro. (2012). Magnetic Energy Harvesting and Concentration at a Distance by Transformation Optics. Physical review letters. 109. 263903. 10.1103/PhysRevLett.109.263903.

Orang Alem, Rahul Mhaskar, Ricardo Jiménez-Martínez, Dong Sheng, John LeBlanc, Lutz Trahms, Tilmann Sander, John Kitching, and Svenja Knappe, "Magnetic field imaging with microfabricated optically-pumped magnetometers," Opt. Express 25, 7849-7858 (2017).

(56) References Cited

OTHER PUBLICATIONS

Slocum et al., Self-Calibrating Vector Magnetometer for Space, https://esto.nasa.gov/conferences/estc-2002/Papers/B3P4(Slocum).pdf.

Dupont-Roc, J & Haroche, S & Cohen-Tannoudji, C. (1969). Detection of very weak magnetic fields (10-9gauss) by 87Rb zero-field level crossing resonances. Physics Letters A—Phys Lett A. 28. 638-639. 10.1016/0375-9601(69) 90480-0.

J. A. Neuman, P. Wang, and A. Gallagher, Robust high-temperature sapphire cell for metal vapors, Review of Scientific Instruments, vol. 66, Issue 4, Apr. 1995, pp. 3021-3023.

Borna, Amir, et al. "A 20-channel magnetoencephalography system based on optically pumped magnetometers." Physics in Medicine & Biology 62.23 (2017): 8909.

R. E. Slocum & L. J. Ryan, Design and operation of the minature vector laser magnetometer, Nasa Earth Science Technology Conference 2003.

Schoenmaker, Jeroen & R Pirota, K & Teixeira, Julio. (2013). Magnetic flux amplification by Lenz lenses. The Review of scientific instruments. 84. 085120. 10.1063/1.4819234.

Hu, Yanhui & Hu, Zhaohui & Liu, Xuejing & Li, Yang & Zhang, Ji & Yao, Han & Ding, Ming. (2017). Reduction of far off-resonance laser frequency drifts based on the second harmonic of electro-optic modulator detection in the optically pumped magnetometer. Applied Optics. 56. 5927. 10.1364/AO.56.005927.

Masuda, Y & Ino, T & Skoy, Vadim & Jones, G.L. (2005), 3He polarization via optical pumping in a birefringent cell. Applied Physics Letters. 87. 10.1063/1.2008370.

A.B. Baranga et al., An atomic magnetometer for brain activity imaging, Real Time Conference 2005. 14th IEEE-NPSS. pp. 417-418.

Larry J. Ryan, Robert E. Slocum, and Robert B. Steves, Miniature Vector Laser Magnetometer Measurements of Earth's Field, May 10, 2004, 4 pgs.

Scott Jeffrey Seltzer: "Developments in alkali-metal atomic magnetometry", Nov. 1, 2008 (Nov. 1, 2008), XP055616618, ISBN: 978-0-549-93355-7 Retrieved from the Internet: URL:http://physics.princeton.edu/atomic/romalis/papers/Seltzer%20Thesis.pdf [retrieved on Aug. 29, 2019] pp. 148-159.

Haifeng Dong et al: "Atomic-Signal-Based Zero-Field Finding Technique for Unshielded Atomic Vector Magnetometer", IEEE Sensors Journal, IEEE Service Center, New York, NY, US, vol. 13, No. 1, Jan. 1, 2013 (Jan. 1, 2013), pp. 186-189.

Lorenz, V. O., Dai, X., Green, H., Asnicar, T. R., & Cundiff, S. T. (2008). High-density, high-temperature alkali vapor cell. Review of Scientific Instruments, 79(12), 4 pages.

Huang, Haichao, et al. "Single-beam three-axis atomic magnetometer." Applied Physics Letters 109.6 (2016): 062404. (Year: 2016).

F. Jackson Kimball, D & Dudley, J & Li, Y & Thulasi, Swecha & Pustelny, Szymon & Budker, Dmitry & Zolotorev, Max. (2016). Magnetic shielding and exotic spin-dependent interactions. Physical Review D. 94. 10.1103/PhysRevD.94.082005.

Effect of magnetic anisotropy on magnetic shaking, E. Papernoa and I. Sasada. Journal of Applied Physics, vol. 85-8, Apr. 1999, pp. 4645-4647.

Feynman Lectures on Physics vol. II, Chapter 37. 1963. Richard Feynman, Robert Leighton, http://www.feynmanlectures.caltech.edu/II_37.html.

Okada, Y.C., Lahteenmäki, A. and Xu, C., "Experimental analysis of distortion of magnetoencephalography signals by the skull." Clinical neurophysiology 110 (2), 230-238 (1999).

Robinson, J.T., Pohlmeyer, E., Gather, M.C., Kemere, C., Kitching, J.E., Malliaras, G.G., Marblestone, A., Shepard, K. L., Stieglitz, T. and Xie, C., "Developing Next-Generation Brain Sensing Technologies—A Review." IEEE sensors journal, 19(22), 10163-10175 (2019).

Shah, V., Knappe, S., Schwindt, P.D. and Kitching, J., "Subpicotesla atomic magnetometry with a microfabricated vapour cell." Nature Photon 1, 649-652 (2007).

Giffilh, W.C., Knappe, S. and Kitching, J., "Femtotesla atomic magnetometry in a microfabricated vapor cell." Optics express 18, (26), 27167-27172 (2010).

Tierney, T.M., Holmes, N., Mellor, S., López, J.D., Roberts, G., Hill, R.M., Boto, E., Leggett, J., Shah, V., Brookes, M.J. and Bowtell, R., "Optically pumped magnetometers: From quantum origins to multi-channel magnetoencephalography." NeuroImage, 199, 598-608 (2019).

Iivanainen, J., Zetter, R., Grön, M., Hakkarainen, K. and Parkkonen, L., "On-scalp MEG system utilizing an actively shielded array of optically-pumped magnetometers." Neuroimage 194, 244-258 (2019).

Iivanainen, J., Stenroos, M. and Parkkonen, L., "Measuring MEG closer to the brain: Performance of on-scalp sensor arrays." NeuroImage 147, 542-553 (2017).

Kitching, J., Knappe, S., Gerginov, V., Shah, V., Schwindt, P.D., Lindseth, B., Donley E.A., "Chip-scale atomic devices: precision atomic instruments based on MEMS" In Frequency Standards and Metrology, 445-453 (2009).

Kitching, J., Knappe, S. and Donley, E.A., "Atomic sensors—a review." IEEE Sensors Journal, 11(9), 1749-1758 (2011).

Budker, D. and Romalis, M., "Optical magnetometry". Nature physics, 3(4), 227-234 (2007).

Happer, W., "Optical pumping", Rev. Mod. Phys., 44 (2), 169-249 (1972).

Purcell, E.M., Field, G.B., "Influence of collisions upon population of hyperfine states in hydrogen", Astrophys. J., 124, 542 (1956).

Ledbetter, M.P., Savukov, I.M., Acosta, V.M., Budker, D. and Romalis, M.V., "Spin-exchange-relaxation-free magnetometry with Cs vapor." Physical Review A, 77(3), 033408 (2008).

Bloom, A. L., "Principles of operation of the rubidium vapor magnetometer." Applied Optics 1(1), 61-68 (1962).

Bell, W.E., and Bloom, A.L., "Optically driven spin precession." Physical Review Letters 6, (6), 280 (1961).

Roberts, G., Holmes, N., Alexander, N., Boto, E., Leggett, J., Hill, R.M., Shah, V., Rea, M., Vaughan, R., Maguire, E.A. and Kessler, K., "Towards OPM-MEG in a virtual reality environment" NeuroImage, 199, 408-417 (2019).

Zhang, R., Xiao, W., Ding, Y., Feng, Y., Peng, X., Shen, L., Sun, C., Wu, T., Wu, Y., Yang, Y. and Zheng, Z., "Recording brain activities in unshielded Earth's field with optically pumped atomic magnetometers." Science Advances, 6(24) (2020).

De Cheveigné, A., Wong, D.D., Di Liberto, G.M., Hjortkjaer, J., Slaney, M. and Lalor, E., "Decoding the auditory brain with canonical component analysis." NeuroImage, 172, 206-216 (2018).

Mellinger, J., Schalk, G., Braun, C., Preissl, H., Rosenstiel, W., Birbaumer, N. and Kübler, A., "An MEG-based brain-computer interface (BCI)." Neuroimage, 36(3), 581-593 (2007).

Wolpaw, J.R., McFarland, D.J., Neat, G.W. and Forneris, C.A., "An EEG-based brain-computer interface for cursor control." Electroencephalography and clinical neurophysiology, 78(3), 252-259 (1991).

Lightfoot, G., "Summary of the N1-P2 cortical auditory evoked potential to estimate the auditory threshold in adults". Seminars in hearing, 37(1), 1 (2016).

Virtanen, J., Ahveninen, J., Ilmoniemi, R. J., Näätänen, R., & Pekkonen, E., "Replicability of MEG and EEG measures of the auditory N1/N1m-response." Electroencephalography and Clinical Neurophysiology/Evoked Potentials Section, 108(3), 291-298 (1998).

Gascoyne, L., Furlong, P. L., Hillebrand, A., Worthen, S. F., & Witton, C., "Localising the auditory N1m with event-related beamformers: localisation accuracy following bilateral and unilateral stimulation." Scientific reports, 6(1), 1-9 (2016).

Borna, A., Carter, T.R., Goldberg, J.D., Colombo, A.P., Jau, Y.Y., Berry, C., McKay, J., Stephen, J., Weisend, M. and Schwindt, P.D., "A 20-channel magnetoencephalography system based on optically pumped magnetometers." Physics in Medicine & Biology, 62(23), 8909 (2017).

Pyragius, T., Marin Florez, H., & Fernholz, T. (2019). A Voigt effect based 3D vector magnetometer. Physical Review A, 100(2), https://doi.org/10.1103/PhysRevA.100.023416.

Rui Zhang, Rahul Mhaskar, Ken Smith, Easswar Balasubramaniam, Mark Prouty. "All Optical Scalar Atomic Magnetometer Capable of Vector Measurement," Submitted on Nov. 17, 2020. https://arxiv.org/abs/2011.08943; Geometries, Inc., San Jose, CA, 95131, USA.

(56) References Cited

OTHER PUBLICATIONS

Boto, E, Holmes, N, Leggett, J, Roberts, G, Shah, V, Meyer, SS, Muñoz, LD, Mullinger, KJ, Tierney, TM, Bestmann, S, Barnes, GR, Bowtell, R & Brookes, MJ 2018, 'Moving magnetoencephalography towards real world applications with a wearable system', Nature, vol. 555, pp. 657-661.

Ijsselsteijn, R & Kielpinski, Mark & Woetzel, S & Scholtes, Theo & Kessler, Ernst & Stolz, Ronny & Schultze, V & Meyer, H-G. (2012). A full optically operated magnetometer array: An experimental study. The Review of scientific instruments. 83. 113106. 10.1063/1.4766961.

Tierney, T. M., Holmes, N., Meyer, S. S., Boto, E., Roberts, G., Leggett, J., . . . Barnes, G. R. (2018). Cognitive neuroscience using wearable magnetometer arrays: Non-invasive assessment of language function. NeuroImage, 181, 513-520.

Hill RM, Boto E, Holmes N, et al. A tool for functional brain imaging with lifespan compliance [published correction appears in Nat Commun. Dec. 4, 2019;10(1):5628]. Nat Commun. 2019;10(1):4785. Published Nov. 5, 2019. doi:10.1038/S41467-019-12486-x.

Zetter, R., Iivanainen, J. & Parkkonen, L. Optical Co-registration of MRI and On-scalp MEG. Sci Rep 9, 5490 (2019) https://doi.org/10.1038/s41598-019-41763-4.

Garrido-Jurado, Sergio, Rafael Muñoz-Salinas, Francisco José Madrid-Cuevas and Manuel J. Marín-Jiménez. "Automatic generation and detection of highly reliable fiducial markers under occlusion." Pattern Recognit. 47 (2014): 2280-2292.

Hill RM, Boto E, Rea M, et al. Multi-channel whole-head OPM-MEG: Helmet design and a comparison with a conventional system [published online ahead of print, May 29, 2020]. Neuroimage. 2020;219:116995. doi:10.1016/j.neuroimage.2020.116995.

V. Kazemi and J. Sullivan, "One millisecond face alignment with an ensemble of regression trees," 2014 IEEE Conference on Computer Vision and Pattern Recognition, Columbus, OH, 2014, pp. 1867-1874, doi: 10.1109/CVPR.2014.241.

Holmes, N., Tierney, T.M., Leggett, J. et al. Balanced, bi-planar magnetic field and field gradient coils for field compensation in wearable magnetoencephalography. Sci Rep 9, 14196 (2019).

N. Holmes, J. Leggett, E. Boto, G. Roberts, R.M. Hill, T.M. Tierney, V. Shah, G.R. Barnes, M.J. Brookes, R. Bowtell A bi-planar coil system for nulling background magnetic fields in scalp mounted magnetoencephalography Neuroimage, 181 (2018), pp. 760-774.

J. M. Leger et. al., In-flight performance of the Absolute Scalar Magnetometer vector mode on board the Swarm satellites, Earth, Planets, and Space (2015) 67:57.

Alexandrov, E. B., Balabas, M. V., Kulyasov, V. N., Ivanov, A. E., Pazgalev, A. S., Rasson, J. L., . . . (2004). Three-component variometer based on a scalar potassium sensor. Measurement Science and Technology, 15(5), 918-922.

Gravrand, O., Khokhlov, A., & JL, L. M. (2001). On the calibration of a vectorial 4He pumped magnetometer. Earth, planets and space , 53 (10), 949-958.

Borna, Amir & Carter, Tony & Colombo, Anthony & Jau, Y-Y & McKay, Jim & Weisend, Michael & Taulu, Samu & Stephen, Julia & Schwindt, Peter. (2018). Non-Invasive Functional-Brain-Imaging with a Novel Magnetoencephalography System. 9 Pages.

Vrba J, Robinson SE. Signal processing in magnetoencephalography. Methods. 2001;25(2):249-271. doi:10.1006/meth.2001.1238.

Uusitalo M and Ilmoniemi R., 1997, Signal-space projection method for separating MEG or EEG into components. Med. Biol. Comput. (35) 135-140.

Taulu S and Kajola M., 2005, Presentation of electromagnetic multichannel data: the signal space separation method. J. Appl. Phys. (97) 124905 (2005).

Taulu S, Simola J and Kajola M., 2005, Applications of the signal space separation method. IEEE Trans. Signal Process. (53) 3359-3372 (2005).

Taulu S, Simola J., 2006, Spatiotemporal signal space separation method for rejecting nearby interference in MEG measurements. Phys. Med. Biol. (51) 1759-1768 (2006).

Johnson, et al., Magnetoencephalography with a two-color pump-probe, fiber-coupled atomic magnetometer, Applied Physics Letters 97, 243703 2010.

Zhang, et al., Magnetoencephalography using a compact multichannel atomic magnetometer with pump-probe configuration, AIP Advances 8, 125028 (2018).

Xia, H. & Ben-Amar Baranga, Andrei & Hoffman, D. & Romalis, Michael. (2006). Magnetoencephalography with an atomic magnetometer. Applied Physics Letters—Appl Phys Lett. 89. 10.1063/1.2392722.

Ilmoniemi, R. (2009). The triangle phantom in magnetoencephalography. In 24th Annual Meeting of Japan Biomagnetism and Bioelecctromagnetics Society, Kanazawa, Japan, 28.29.5.2009 (pp. 6263).

Oyama D. Dry phantom for magnetoencephalography—Configuration, calibration, and contribution. J Neurosci Methods. 2015;251:24-36. doi: 0.1016/j.jneumeth.2015.05.004.

Chutani, R., Maurice, V., Passilly, N. et al. Laser light routing in an elongated micromachined vapor cell with diffraction gratings for atomic clock applications. Sci Rep 5, 14001 (2015). https://doi.org/10.1038/srep14001.

Eklund, E. Jesper, Andrei M. Shkel, Svenja Knappe, Elizabeth A. Donley and John Kitching. "Glass-blown spherical microcells for chip-scale atomic devices." (2008).

Jiménez-Martínez R, Kennedy DJ, Rosenbluh M, et al. Optical hyperpolarization and NMR detection of 129Xe on a microfluidic chip. Nat Commun. 2014;5:3908. Published May 20, 2014. doi:10.1038/ncomms4908.

Boto, Elena, Sofie S. Meyer, Vishal Shah, Orang Alem, Svenja Knappe, Peter Kruger, T. Mark Fromhold, et al. "A New Generation of Magnetoencephalography: Room Temperature Measurements Using Optically-Pumped Magnetometers." NeuroImage 149 (Apr. 1, 2017): 404-14.

Bruno, A. C., and P. Costa Ribeiro. "Spatial Fourier Calibration Method for Multichannel SQUID Magnetometers." Review of Scientific Instruments 62, No. 4 (Apr. 1, 1991): 1005-9.

Chella, Federico, Filippo Zappasodi, Laura Marzetti, Stefania Della Penna, and Vittorio Pizzella. "Calibration of a Multichannel MEG System Based on the Signal Space Separation Method." Physics in Medicine and Biology 57 (Jul. 13, 2012): 4855-70.

Pasquarelli, A, M De Melis, Laura Marzetti, Hans-Peter Muller, and S N Erné. "Calibration of a Vector-MEG Helmet System." Neurology & Clinical Neurophysiology□: NCN 2004 (Feb. 1, 2004): 94.

Pfeiffer, Christoph, Lau M. Andersen, Daniel Lundqvist, Matti Hämäläinen, Justin F. Schneiderman, and Robert Oostenveld. "Localizing On-Scalp MEG Sensors Using an Array of Magnetic Dipole Coils." PLOS ONE 13, No. 5 (May 10, 2018): e0191111.

Vivaldi, Valentina, Sara Sommariva, and Alberto Sorrentino. "A Simplex Method for the Calibration of a MEG Device." Communications in Applied and Industrial Mathematics 10 (Jan. 1, 2019): 35-46.

Nagel, S., & Spüler, M. (2019). Asynchronous non-invasive high-speed BCI speller with robust non-control state detection. Scientific Reports, 9(1), 8269.

Thielen, J., van den Broek, P., Farquhar, J., & Desain, P. (2015). Broad-Band Visually Evoked Potentials: Re(con) volution in Brain-Computer Interfacing. PLoS One, 10(7), e0133797. https://doi.org/10.1371/journal.pone.0133797.

J. Kitching, "Chip-scale atomic devices," Appl. Phys. Rev. 5(3), 031302 (2018), 39 pages.

Manon Kok, Jeroen D. Hol and Thomas B. Schon (2017), "Using Inertial Sensors for Position and Orientation Estimation", Foundations and Trends in Signal Processing: vol. 11: No. 1-2, pp. 1-153. http://dx.doi.org/10.1561/2000000094.

* cited by examiner

MAGNETIC FIELD MEASUREMENT SYSTEM WITH AMPLITUDE-SELECTIVE MAGNETIC SHIELD

CROSS-REFERENCE TO RELATED APPLICATIONS

This application claims the benefit of U.S. Provisional Patent Application Ser. Nos. 62/796,958, filed Jan. 25, 2019, and 62/827,390, filed Apr. 1, 2019, both of which are incorporated herein by reference in their entireties.

FIELD

The present disclosure is directed to the area of magnetic field measurement systems using one or more optically pumped magnetometers. The present disclosure is also directed to magnetic field measurement systems and methods that include an amplitude-selective magnetic shield.

BACKGROUND

In the nervous system, neurons communicate with one another via action potentials. These are brief electric currents which flow down the length of a neuron causing chemical transmitters to be released at a synapse. The time-varying electrical currents within an ensemble of neurons generate a magnetic field, which can be measured using either a Superconductive Quantum Interference Device (SQUID) or an Optically Pumped Magnetometer (OPM). Detection of neural signals has been demonstrated inside magnetically shielded rooms. OPMs are primarily considered herein because the SQUID requires cryogenic cooling, which may make it prohibitively costly for users.

Optical magnetometry is the use of optical methods to measure a magnetic field with very high accuracy—on the order of $1\times10^{-15}$ Tesla (1 fT). These OPM sensors are of particular interest in the measurement of biological magnetism such as magnetencephalography (MEG). One significant difficulty with this approach is the difference in scale between the biological signals, which are on the order of 1 fT to 1 pT, and the magnetic field of the Earth, which is 20 $\mu$T to 50 $\mu$T depending on location. The difference in scale therefore can be as much as 50 billion times. Conventional magnetic field reduction techniques include: 1) a magnetically shielded room to reduce the strength of the Earth field by 1,000 to 10,000 times; or 2) an optically pumped magnetometer (OPM) sensor architecture with a wide dynamic range. As an example of the first approach, a magnetically shielded room of high permeability mumetal costing in excess of $100 k USD and weighing many tons has been used. The second approach has historically resulted in poor sensitivity.

BRIEF SUMMARY

One embodiment is a wearable assembly that includes at least one magnetometer and a shield disposed around the magnetometer. The shield includes a first portion and the first portion is configured to provide a shielding factor of at least 10 for a magnetic field having a magnetic field amplitude of 10 $\mu$T and to provide a shielding factor of no more than 2 for a magnetic field having a magnetic field amplitude of 1 nT.

In at least some embodiments, an entirety of the shield is configured to provide a shielding factor of at least 10 for a magnetic field having a magnetic field amplitude of 10 $\mu$T and to provide a shielding factor of no more than 2 for a magnetic field having a magnetic field amplitude of 1 nT. In at least some embodiments, the first portion is made of an amorphous alloy including cobalt and iron and further including at least one of molybdenum, boron, silicon, or nickel.

In at least some embodiments, the shield includes a second portion configured to provide a shielding factor of at least 10 for a magnetic field having a magnetic field amplitude of 1 nT. In at least some embodiments, the second portion is made of mumetal. In at least some embodiments, the first portion is a first layer and the second portion is a second layer disposed over or under the first layer. In at least some embodiments, the second portion overlaps only part, which is less than an entirety, of the first portion.

Another embodiment is a magnetic field measurement system for measurement of weak magnetic field signals that includes any of the wearable assemblies described above, where the first portion of the shield is configured for positioning between the at least one magnetometer and a source of the weak magnetic field signals.

A further embodiment is a magnetic field measurement system for measurement of weak magnetic field signals that includes at least one magnetometer and a shield disposed around the magnetometer. The shield includes a first portion configured for positioning between the at least one magnetometer and a source of the weak magnetic field signals. The first portion is configured to provide attenuation of a magnetic field having a magnetic field amplitude of 10 $\mu$T by at least 90% and to provide attenuation of a magnetic field having a magnetic field amplitude of 1 nT by no more than 50%.

In at least some embodiments, an entirety of the shield is configured to provide attenuation of a magnetic field having a magnetic field amplitude of 10 $\mu$T by at least 90% and to provide attenuation of a magnetic field having a magnetic field amplitude of 1 nT by no more than 50%. In at least some embodiments, the first portion is made of an amorphous alloy including cobalt and iron and further including at least one of molybdenum, boron, silicon, or nickel.

In at least some embodiments, the shield includes a second portion configured to provide attenuation of a magnetic field having a magnetic field amplitude of 1 nT by at least 90%. In at least some embodiments, the second portion is made of mumetal. In at least some embodiments, the first portion is a first layer and the second portion is a second layer disposed over or under the first layer. In at least some embodiments, the second portion overlaps only part, which is less than an entirety, of the first portion.

Yet another embodiment is a magnetic field measurement system for measurement of weak magnetic field signals that includes at least one magnetometer and a shield disposed around the magnetometer. The shield includes a first portion configured for positioning between the at least one magnetometer and a source of the weak magnetic field signals. The first portion is made of an amorphous alloy including cobalt and iron which preferentially passes magnetic fields having a magnetic field amplitude of 500 nT or less.

In at least some embodiments, the first portion of the shield is configured to provide attenuation of a magnetic field having a magnetic field amplitude of 10 $\mu$T by at least 90% and to provide attenuation of a magnetic field having a magnetic field amplitude of 1 nT by no more than 50%.

In at least some embodiments, the first portion of the shield is configured to provide a shielding factor of at least 10 for a magnetic field having a magnetic field amplitude of 10 $\mu$T and to provide a shielding factor of no more than 2 for a magnetic field having a magnetic field amplitude of 1 nT. In at least some embodiments, the shield further includes a second portion configured to provide a shielding factor of at least 10 for a magnetic field having a magnetic field amplitude of 1 nT. In at least some embodiments, the second portion overlaps only part, which is less than an entirety, of the first portion.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present disclosure is directed to the area of magnetic field measurement systems using one or more optically pumped magnetometers. The present disclosure is also directed to magnetic field measurement systems and methods that include an amplitude-selective magnetic shield.

Herein the terms "ambient background magnetic field" and "background magnetic field" are interchangeable and used to identify the magnetic field or fields associated with sources other than the magnetic field measurement system and the biological source(s) (for example, neural signals from a user's brain) or other source(s) of interest. The terms can include, for example, the Earth's magnetic field, as well as magnetic fields from magnets, electromagnets, electrical devices, and other signal or field generators in the environment, except for any magnetic field generator(s) that are part of the magnetic field measurement system.

The terms "gas cell", "vapor cell", and "vapor gas cell" are used interchangeably herein. Below, a gas cell containing alkali metal vapor is described, but it will be recognized that other gas cells can contain different gases or vapors for operation.

An optically pumped magnetometer (OPM) is a basic component used in optical magnetometry to measure magnetic fields. While there are many types of OPMs, in general magnetometers operate in two modalities: vector mode and scalar mode. In vector mode, the OPM can measure one, two, or all three vector components of the magnetic field; while in scalar mode the OPM can measure the total magnitude of the magnetic field.

Vector mode magnetometers measure a specific component of the magnetic field, such as the radial and tangential components of magnetic fields with respect the scalp of the human head. Vector mode OPMs often operate at zero-fields and may utilize a spin exchange relaxation free (SERF) mode to reach femto-Tesla sensitivities. A SERF mode OPM is one example of a vector mode OPM, but other vector mode OPMs can be used at higher magnetic fields. These SERF mode magnetometers can have high sensitivity but in general cannot function in the presence of magnetic fields higher than the linewidth of the magnetic resonance of the atoms of about 10 nT, which is much smaller than the magnetic field strength generated by the Earth. As a result, conventional SERF mode magnetometers often operate inside magnetically shielded rooms that isolate the sensor from ambient magnetic fields including Earth's.

Magnetometers operating in the scalar mode can measure the total magnitude of the magnetic field. (Magnetometers in the vector mode can also be used for magnitude measurements.) Scalar mode OPMs often have lower sensitivity than SERF mode OPMs and are capable of operating in higher magnetic field environments.

Figure 1:
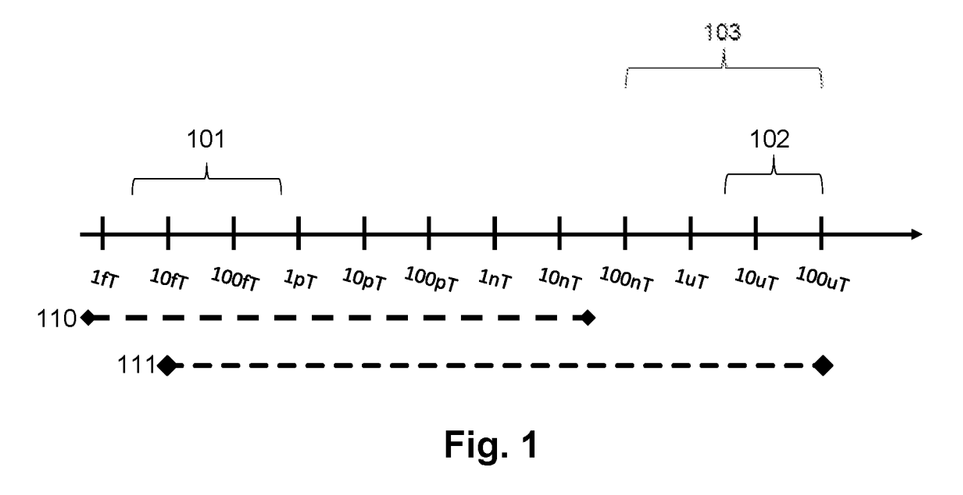
FIG. 1 shows a magnetic spectrum with lines indicating dynamic ranges of magnetometers operating in different modes.

FIG. 1 shows the magnetic spectrum from 1 fT to 100 µT in magnetic field strength on a logarithmic scale. The magnitude of magnetic fields generated by the human brain are indicated by range 101 and the magnitude of the background ambient magnetic field, including the Earth's magnetic field, by range 102. The strength of the Earth's magnetic field covers a range as it depends on the position on the Earth as well as the materials of the surrounding environment where the magnetic field is measured. Range 110 indicates the approximate measurement range of a magnetometer (e.g., an OPM) operating in the SERF mode (e.g., a SERF magnetometer) and range 111 indicates the approximate measurement range of a magnetometer operating in the scalar mode (e.g., a scalar magnetometer.) As indicated above, a SERF magnetometer is more sensitive than a scalar magnetometer but many conventional SERF magnetometers only operate up to about 0 to 200 nT while the scalar magnetometer starts in the 10 to 100 fT range and can extend above 10 to 100 µT.

Magnetically shielded rooms have been used with OPMs to block unwanted magnetic signals from the OPM. Unwanted signals can arise from, for example, the Earth's magnetic field and the magnetic field from other signal sources, such as, power lines, cars, trains, phones, electronic equipment, other equipment, and the like. Many conventional OPM arrangements use magnetically shielded rooms and, therefore, are not portable or wearable, are very expensive, or are typically assembled on site by a trained crew over several weeks. This limitation on use, cost, assembly, or portability has significantly limited the adoption of the OPM technology.

Magnetically shielded rooms are typically made using a high permeability metal such as mumetal. Mumetal is effective at blocking magnetic fields of less than 1 Tesla making it a good material for blocking the Earth's magnetic field, as well as weaker, undesirable magnetic fields.

Conventional shielding materials, such as mumetal, generally attenuate magnetic fields along the entire spectrum and, therefore, also attenuate the biological magnetic fields of interest in addition to the Earth's magnetic field and other ambient background magnetic fields. In many conventional applications, a magnetically shielded room for an OPM provides magnetic field reduction to a level below 10 nT and often below or around 1 nT. In at least some instances, the magnetometer(s) and the signal source are both disposed within the magnetically shielded room and, therefore, the shielding of the room does not attenuate the signals from the signal source. This shielding arrangement is not portable or wearable.

In contrast to mumetal, there are materials that provide attenuation of magnetic fields above a threshold amplitude, but provide little or no attenuation of magnetic fields below the threshold amplitude. These materials are referred to herein as amplitude-selective magnetic field attenuation materials. As an example of such a material, Metglas™ 2705 (available from Metglas, Inc., Conway, S.C., USA) provides magnetic field shielding above 1 µT, but is generally not an effective magnetic shield below a few 100 nT. Other Metglas™ magnetic materials, such as Metglas™ 2714, and materials such as Vitrovac™ 6025 X (available from Sekels GmbH, Ober-Moerlen, Germany) are additional examples of amplitude-selective magnetic field attenuation materials.

Metglas™ is a metal foil 'glass' (e.g., an amorphous material) in which the atomic patterning of the constituent atoms is randomly arranged, instead of being in a crystalline pattern like mumetal. The random patterning often allows this metal foil to be cut, bent, and flexed without degrading its magnetic shielding performance. As indicated above, Metglas™ generally is not suitable for magnetic shielding because it is a very poor magnetic shield at low magnetic fields. In addition, Metglas™ is presently more expensive than mumetal.

In at least some embodiments, an amplitude-selective magnetic field attenuation material is an amorphous cobalt-iron alloy with one or more of the following additional components: molybdenum, boron, silicon, or nickel. For example, one such material contains 66.6 at. % cobalt, 3.7 at. % iron, 1.2 at. % molybdenum, 11.4 at. % boron, and 17.1 at. % silicon. Another material contains approximately 69 at. % cobalt, 4 at. % iron, 1 at. % nickel, 2 at. % molybdenum, 12 at. % boron, and 12 at. % silicon. Yet another material contains approximately 66 at. % cobalt, 4 at. % iron, 1 at. % nickel, 14 at. % boron, and 15 at. % silicon.

Figure 2:
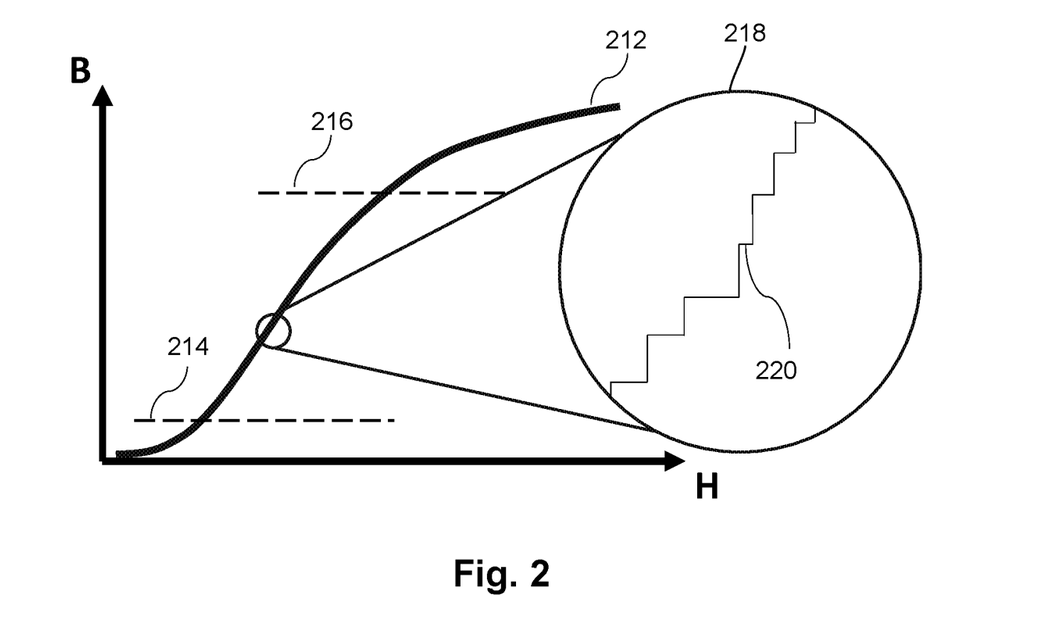
FIG. 2 is a BH response curve (where B is the magnetic flux density, and H is the magnetic field intensity) for one example of a magnetic material which demonstrates amplitude-selective magnetic field attenuation; according to the invention.

Experimental observations of amplitude-selective magnetic field attenuation was described by German physicist Heinrich Barkhausen in 1919 and has been referred to as the Barkhausen effect. Although not wishing to restrict the invention to any particular theory, an example of the Barkhausen effect is presented in FIG. 2 which shows a BH response curve (where B is the magnetic flux density, and H is the magnetic field intensity) for one example of a magnetic material which demonstrates amplitude-selective magnetic field attenuation. The BH curve 212 has three regions, below line 214, between line 214 and line 216, and above line 216. Of most interest for this application is the region between line 214 and line 216 where the BH curve has a steeper slope. Steeper BH curves typically indicate a better magnetic shielding material.

Materials that exhibit amplitude-selective magnetic field attenuation will attenuate large amplitude changes in magnetic field, but pass small amplitude changes, such as those arising from neural or other biological sources. As illustrated in the expanded portion 218 of the BH curve 212 of FIG. 2, in this steeper region, the BH response is actually jagged or stepped and has relatively flat sections 220. Although it will be understood that the present invention does not rely on any particular theory, this response is thought to arise from discrete changes in the size or rotation of ferromagnetic domains. As illustrated in the expanded portion 218 of the BH curve 212, for small perturbations of the magnetic field intensity H, below a threshold, there is no change in the magnetic flux density as demonstrated by the flat sections of the BH curve. In at least some embodiments, the threshold represents the width ($\Delta H$) of the flat section 220. Thus, small magnetic field perturbations less than this threshold are not shielded (e.g., the BH curve is flat) because the magnetic flux intensity B does not change in response to the magnetic field intensity H. Magnetic field amplitude changes larger than the threshold are shielded.

Figure 3:
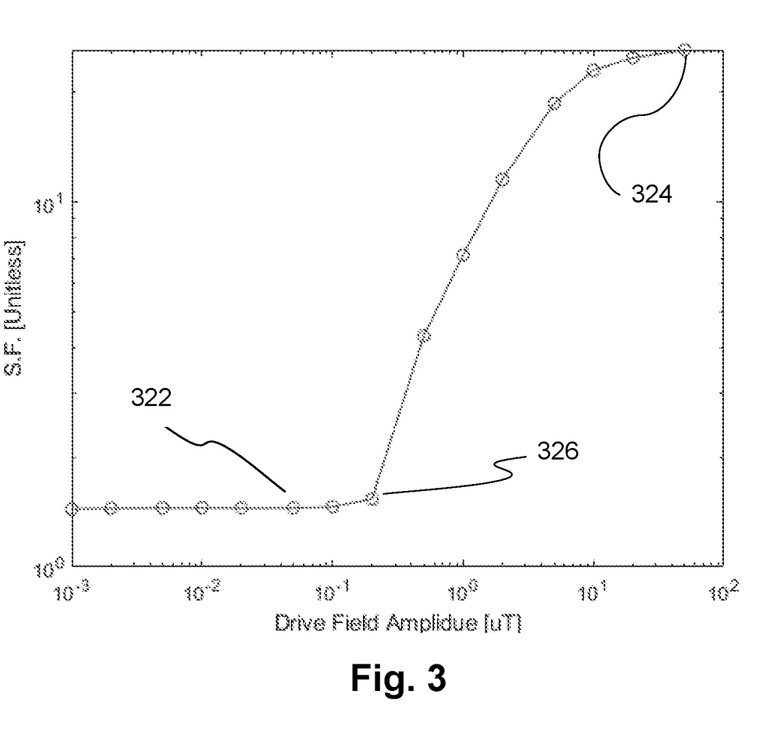
FIG. 3 illustrates a shielding factor (S.F.) plot for one embodiment of a shield made using a single layer of a 20 µm thick Metglas™ 2705 sheet wrapped into an open cylinder, where the cylinder is about 20 mm in length and 20 mm in diameter; according to the invention.

As an example, FIG. 3 illustrates a shielding factor (S.F.) plot for one embodiment of a shield made using a single layer of a 20 µm thick Metglas™ 2705 sheet wrapped into an open cylinder, where the cylinder is about 20 mm in length and 20 mm in diameter. The shielding factor is the ratio of the magnetic field measured without the shield to the magnetic field measured with the shield in place. For example, if the magnetic field is 100 nT without shielding and 10 nT with shielding then the shielding factor is 10 (i.e., 100 nT/10 nT). This plot shows the shielding factor for a range of magnetic field amplitudes from 1 nT to 50 µT. The magnetic field frequency used in this example was 70 Hz which is within a typical range for neural signals. The low magnetic field amplitude shielding factor 322 for this shield was about 1.5 at 1 nT ($1\times10^{-3}$ µT on the plot) and 25 at 50 µT (point 324). The cutoff amplitude was at approximately 200 nT (point 326).

Since Metglas 2705 can shield large magnetic fields, but not small magnetic fields, it is an example of a material that can be used to build an amplitude-selective magnetic shield ("ASMS") with a high-amplitude cutoff in the range of about 100 nT to depending on the geometry of the shield. Other materials exhibiting the Barkhausen effect, as well as any other suitable amplitude-selective magnetic field attenuation material, can also be used for the ASMS. In at least some embodiments, characteristics of the ASMS, such as attenuation at low or high magnetic field amplitudes or a cutoff/threshold magnetic field, can be altered or selected by changing the materials used, the material thickness, or the geometry of the shield shape. In at least some embodiments, by building composite layers of materials, each with possibly a different magnetic field attenuation response, it is possible to tune the behavior of the ASMS for particular applications or specifications.

In at least some embodiments, a suitable material for an ASMS has an amplitude threshold for the change from attenuation to no attenuation that is larger than the strength of the magnetic fields that should be allowed or transmitted through the shield. In at least some embodiments, a material for an ASMS has a threshold for the change from attenuation to no attenuation that is just slightly larger (for example, no more than 100%, 50%, 25%, 10%, 5%, or less) than the strength of the magnetic fields that should be allowed or transmitted through the shield.

Returning to FIG. 1, the range of magnetic fields blocked by at least some embodiments of amplitude-selective magnetic shields disclosed herein is indicated by range 103. Fields above about 100 nT, for example, are increasingly attenuated by the example shield while fields below 100 nT, for example are passed with little to no attenuation.

A shield, or a portion of a shield, can be an ASMS and provide substantially different shielding factors at different magnetic field amplitudes. In at least some embodiments, a shield, as described further herein, includes a portion (which may be the entire shield) which provides a shielding factor of at least 10, 15, 20, 25, 40, 50, 75, 100 for a magnetic field having a magnetic field amplitude of 1, 5, 10, 25, 50 or 100 µT and provides a shielding factor of no more than 2.5, 2, 1.5, or 1 for a magnetic field having a magnetic field amplitude of 100 or 500 pT or 1, 5, 10, 25, 50, 100, 250, or 500 nT. In at least some embodiments, the selection of particular values may depend on the application in which the shield is used. As one example, a portion of a shield provides a shielding factor of at least 10 for a magnetic field having a magnetic field amplitude of 10 µT and provides a shielding factor of no more than 2 for a magnetic field having a magnetic field amplitude of 1 nT. In at least some embodiments, the low shielding factor is applicable to magnetic fields having a frequency of 10 kHz or less or 1 kHz or less.

In at least some embodiments, an ASMS may be characterized using a ratio of 1) the shielding factor for a first magnetic field amplitude, and 2) the shielding factor for a second magnetic field amplitude. In at least some embodiments, this ratio is at least 10, 15, 20, 25, 40, 50, 75, 100 for a first magnetic field amplitude of 1, 5, 10, 25, 50 or 100 µT and a second magnetic field amplitude of 100 or 500 pT or 1, 5, 10, 25, 50, 100, 250, or 500 nT. In at least some embodiments, this ratio is at least 10, 15, 20, 25, 40, 50, 75, 100 for a first magnetic field amplitude selected from the range of 1 to 100 µT and a second magnetic field amplitude selected from the range of 100 pT to 500 nT.

In at least some embodiments, the ASMS may also be considered a low pass magnetic field amplitude filter. In at least some embodiments, the ASMS preferentially passes magnetic fields having a magnetic field amplitude of a first amplitude or less where the first amplitude is 100 or 500 pT or 1, 5, 10, 25, 50, 100, 250, or 500 nT. The preferential passage of magnetic fields of the first amplitude or less can be made in comparison to magnetic fields of a second amplitude or more where the second amplitude is 1, 5, 10, 25, 50 or 100 µT.

As another example, an ASMS may attenuate a magnetic field having a magnetic field amplitude of 1, 5, 10, 25, 50 or 100 µT by at least 50, 60, 70, 80, 90, 95, 99, 99.5, or 99.9% and attenuate a magnetic field having a magnetic field amplitude of 100 or 500 pT or 1, 5, 10, 25, 50, 100, 250, or 500 nT by no more than 50, 40, 25, 20, 15, 10, 5, or 1%.

Figure 4:
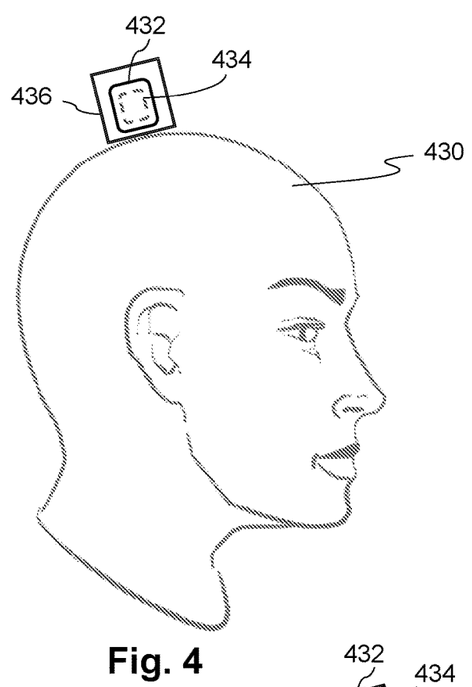
FIG. 4 is a schematic view of one embodiment of an arrangement of a magnetometer and a shield, according to the invention.

FIG. 4 illustrates one embodiment of an assembly for use in measuring neural signals from a user 430. This assembly includes an OPM 432 which contains an alkali gas cell 434 surrounded by shield 436. At least a portion of the shield 436 forms an amplitude selective magnetic shield (ASMS). In at least some embodiments, the entire assembly can be placed on the user's head to measure neural signals which pass with low loss through the ASMS portion of the shield 436.

Figure 5:
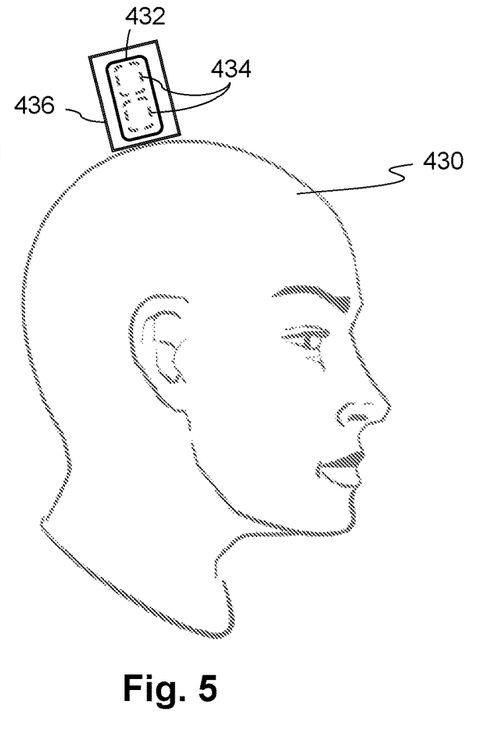
FIG. 5 is a schematic view of one embodiment of an arrangement of a magnetometer with two alkali gas cells and a shield, according to the invention.

FIG. 5 illustrates another embodiment of an assembly with an OPM configured in a dual cell structure having two alkali gas cells 434 per OPM 432. The second alkali gas cell (upper cell) allows common mode magnetic noise, including, for example, noise generated by the ASMS, to be subtracted. This configuration of two magnetometers is often called a gradiometer.

Figure 6:
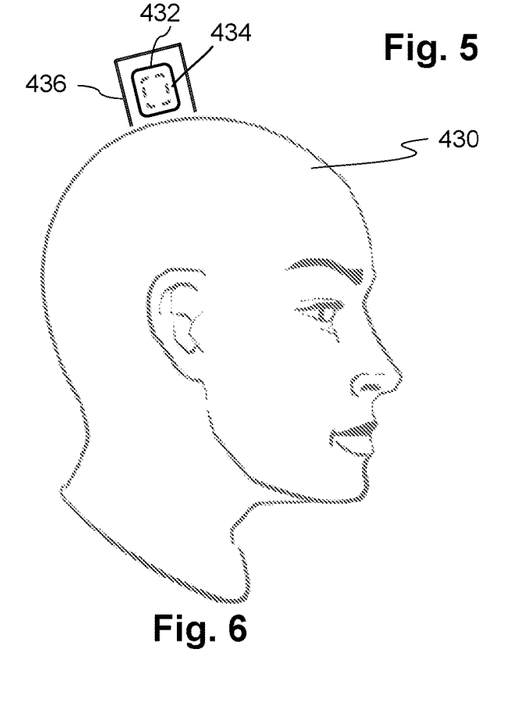
FIG. 6 is a schematic view of another embodiment of an arrangement of a magnetometer and a shield, according to the invention.

In some instances, it may be undesirable to fully enclose the OPM in a shield or an ASMS. For example, it may be useful to filter signals from only one direction. In other instances, it may be desirable that the shield have different cut-off amplitudes for magnetic fields in different spatial orientations. FIG. 6 illustrates a shield 436, including at least a portion with an ASMS, with one open face toward the user. This shield will have a larger shielding factor for horizontal magnetic fields as compared to vertical magnetic fields.

In at least some embodiments, an amplitude selective magnetic shield (ASMS) is positioned between a magnetometer, or any array of magnetometers, and a source of magnetic field signals that are to be measured or otherwise observed. In some embodiments, the ASMS surrounds the magnetometer or array of magnetometers. In at least some embodiments, the ASMS forms a portion of a shield or is used in conjunction with other shielding material to form a shield.

Figure 7A:
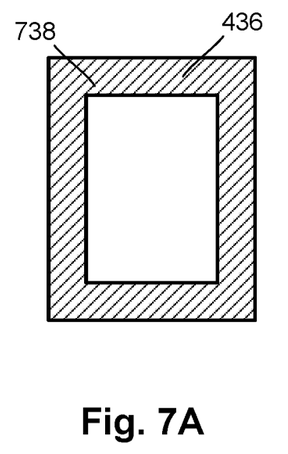
FIG. 7A is a schematic cross-sectional view of one embodiment of an amplitude-selective magnetic shield (ASMS), according to the invention.
Figure 7B:
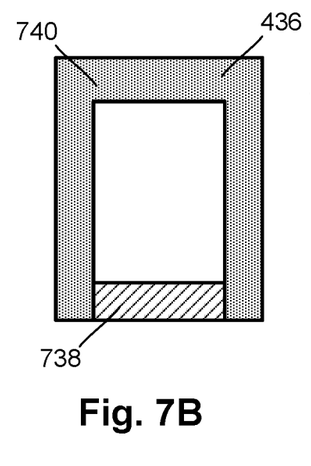
FIG. 7B is a schematic cross-sectional view of one embodiment of a shield that incorporates an ASMS, according to the invention.

FIGS. 7A-7D schematically illustrate different embodiments of a shield 436. In at least some embodiments, the entire shield 436 is an ASMS 738, as illustrated in FIG. 7A. FIG. 7B illustrates another embodiment in which a portion of the shield 436 is an ASMS along one or more sides of the shield and the remainder of the shield is a convention shield 740 made of a material such as mumetal which is not an amplitude-selective magnetic field attenuation material.

In at least some embodiments, the layer 740 of the conventional shield material provides a shielding factor of at least 10, 15, 20, 25, 40, 50, 75, 100 for a magnetic field having a magnetic field amplitude of 100 or 500 pT or 1, 5, 10, 25, 50, 100, 250, or 500 nT. In at least some embodiments, the layer 740 of the conventional shield material provides attenuation of a magnetic field having a magnetic field amplitude of 100 or 500 pT or 1, 5, 10, 25, 50, 100, 250, or 500 nT by a factor of at least 10, 15, 20, 25, 40, 50, 75, 100.

Figure 7C:
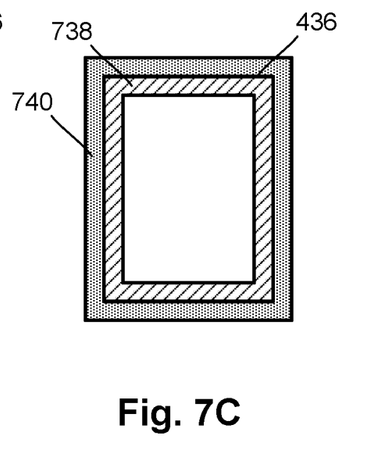
FIG. 7C is a schematic cross-sectional view of another embodiment of a shield that incorporates an ASMS, according to the invention.

FIG. 7C illustrates a shield 436 with one layer of ASMS 738 and another layer 740 of a conventional shield material, such as mumetal, which is not an amplitude-selective magnetic field attenuation material. It will be understood that other embodiments can include two or more layers 738, two or more layers 740, or any combination thereof.

In FIG. 7C, layer 738 and layer 740 overlap each other completely and layer 740 is disposed over layer 738. It will be understood that in other embodiments, layer 740 may be disposed under layer 738 or that one or more portions of layer 740 may be disposed over one or more portions of layer 738 and one or more other portions of layer 740 may be disposed under one or more other portions of layer 738.

Figure 7D:
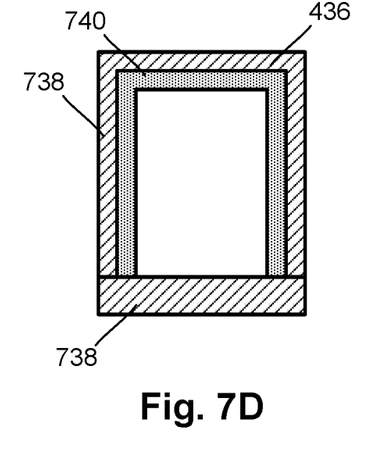
FIG. 7D is a schematic cross-sectional view of a third embodiment of a shield that incorporates an ASMS, according to the invention.

It will also be understood that different numbers or arrangements of layers may be provided for different portions of the shield 436. For example, as illustrated in FIG. 7D, the shield 436 includes one side that only has an ASMS layer 738 and other sides that include both an ASMS layer 738 and a layer 740 of a conventional shield material, such as mumetal, which is not an amplitude-selective magnetic field attenuation material. In FIG. 7D, along one side (at the bottom of FIG. 7D) of the shield 436, layer 740 does not overlap with layer 738. In FIG. 7D, layer 740 overlaps only part, which is less than an entirety, of the layer 738. In at least some embodiments, an air gap (not shown) may be provided between the layers 738, 740. For example, the air gap can be in the range of 2 to 5 mm in width.

Any other suitable arrangement of one or more layers 738 and one or more layer 740 can be used. It will also be understood that the shield 436 can have any suitable shape including, but not limited to, a cube, cuboid, rectangular prism, square-based pyramid, triangular-based pyramid, triangular prism, cylinder, cone, sphere, hemisphere, hexagonal prism, octagonal prism, or any other regular or irregular shape, In some embodiments, the ASMS 738 is made using strips of the amplitude-selective magnetic field attenuation material, such as Metglas™ 2705. As an example, strips having a width of 1.5 to 2.5 mm can be used (although other embodiments can employ strips of any other suitable width) with a gap between strips in the range of 0.5 to 1.5 mm (although any other suitable gap width can be used in other embodiments.)

Figure 8:
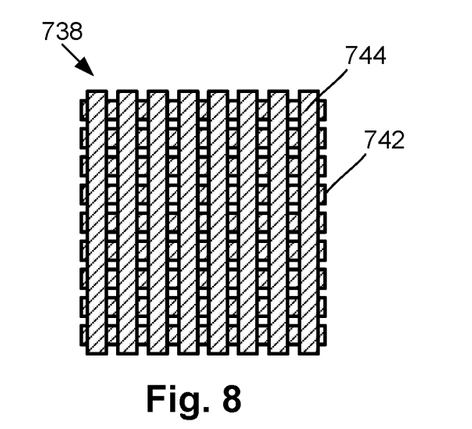
FIG. 8 is a schematic view of two layers of an ASMS with each layer formed from strips, according to the invention.

In some embodiments, the amplitude-selective magnetic field attenuation material provides the desired shielding properties in a single direction, or limited range of directions, which, at least in some instances, may follow a grain of the material. In some embodiments, using such materials, the ASMS 738 may include strips 842 arranged along a first direction and strips 844 arranged along a second direction, as illustrated in FIG. 8. In the illustrated embodiment, the strips 842, 844 are layered, but in other embodiments, the strips may be interwoven. In other embodiments, there may be more than two layers or two strip directions. In the illustrated embodiment, the strips 842 are oriented perpendicular to the strips 844. In other embodiments, the angle between strips 842 and strips 844 can be any value ranging from 5 to 90 degrees.

The ASMS, as described herein, can be incorporated into a magnetic field measurement system. A magnetic field measurement system, as described herein, can include one or more (for example, an array of) optically pumped magnetometers. Examples of magnetic field measurement systems that utilize an OPM and can incorporate an ASMS, as described herein, are described in U.S. patent application Ser. Nos. 16/213,980; 16/405,382; 16/418,478; 16/418,500; 16/428,871; 16/456,975; 16/457,655; 16/573,394; 16/573,524; and Ser. No. 16/679,048, and U.S. Provisional Patent Application Ser. Nos. 62/689,696; 62/699,596; 62/719,471; 62/719,475; 62/719,928; 62/723,933; 62/732,327; 62/732,791; 62/741,777; 62/743,343; 62/747,924; 62/745,144; 62/752,067; 62/776,895; 62/781,418; 62/796,958; 62/798,209; 62/798,330; 62/804,539; 62/826,045; 62/827,390; 62/836,421; 62/837,574; 62/837,587; 62/842,818; 62/855,820; 62/858,636; 62/860,001; 62/865,049; 62/873,694; 62/874,887; 62/883,399; 62/883,406; 62/888,858; 62/895,197; 62/896,929; 62/898,461; 62/910,248; 62/913,000; 62/926,032; 62/926,043; and 62/933,085, all of which are incorporated herein by reference in their entireties.

A magnetic field measurement system can be used to measure or observe electromagnetic signals generated by one or more sources (for example, biological sources). For example, the system can measure biologically generated magnetic fields from the brain or other parts of the body. Aspects of a magnetic field measurement system will be exemplified below using magnetic signals from the brain of a user; however, biological signals from other areas of the body, as well as non-biological signals, can be measured using the system. This technology can also be applicable for uses outside biomedical sensing. In at least some embodiments, the system can be a wearable MEG system that can be used outside a magnetically shielded room. Examples of wearable MEG systems are described in U.S. Non-Provisional patent application Ser. No. 16/457,655 which is incorporated herein by reference in its entirety.

Figure 9A:
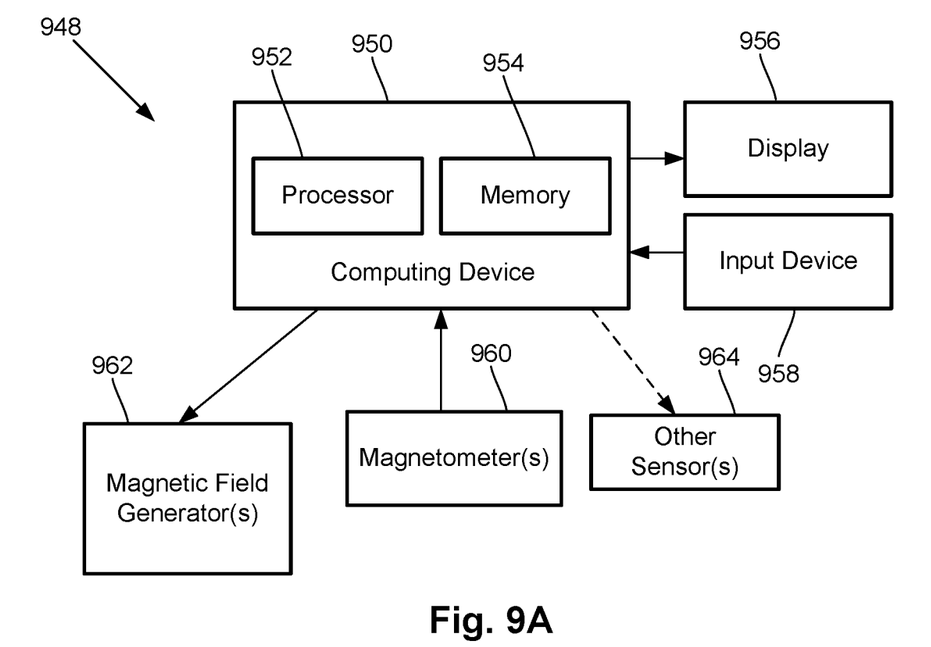
FIG. 9A is a schematic block diagram of one embodiment of a magnetic field measurement system, according to the invention.

FIG. 9A is a block diagram of components of one embodiment of a magnetic field measurement system 948. The system 948 can include a computing device 950 or any other similar device that includes a processor 952 and a memory 954, a display 956, an input device 958, one or more magnetometers 960 (for example, an array of magnetometers) which can be OPMs, one or more optional magnetic field generators 962, and, optionally, one or more sensors 964. The system 948 and its use and operation will be described herein with respect to the measurement of neural signals arising from signal sources in the brain of a user as an example. It will be understood, however, that the system can be adapted and used to measure other neural signals, other biological signals, as well as non-biological signals.

The computing device 950 can be a computer, tablet, mobile device, field programmable gate array (FPGA), microcontroller, or any other suitable device for processing information or instructions. The computing device 950 can be local to the user or can include components that are non-local to the user including one or both of the processor 952 or memory 954 (or portions thereof). For example, in at least some embodiments, the user may operate a terminal that is connected to a non-local computing device. In other embodiments, the memory 954 can be non-local to the user.

The computing device 950 can utilize any suitable processor 952 including one or more hardware processors that may be local to the user or non-local to the user or other components of the computing device. The processor 952 is configured to execute instructions for operation of the magnetic field measurement system.

Any suitable memory 954 can be used for the computing device 950. The memory 954 illustrates a type of computer-readable media, namely computer-readable storage media. Computer-readable storage media may include, but is not limited to, volatile, nonvolatile, non-transitory, removable, and non-removable media implemented in any method or technology for storage of information, such as computer readable instructions, data structures, program modules, or other data. Examples of computer-readable storage media include RAM, ROM, EEPROM, flash memory, or other memory technology, CD-ROM, digital versatile disks ("DVD") or other optical storage, magnetic cassettes, magnetic tape, magnetic disk storage or other magnetic storage devices, or any other medium which can be used to store the desired information and which can be accessed by a computing device.

Communication methods provide another type of computer readable media; namely communication media. Communication media typically embodies computer-readable instructions, data structures, program modules, or other data in a modulated data signal such as a carrier wave, data signal, or other transport mechanism and include any information delivery media. The terms "modulated data signal," and "carrier-wave signal" includes a signal that has one or more of its characteristics set or changed in such a manner as to encode information, instructions, data, and the like, in the signal. By way of example, communication media includes wired media such as twisted pair, coaxial cable, fiber optics, wave guides, and other wired media and wireless media such as acoustic, RF, infrared, and other wireless media.

The display 956 can be any suitable display device, such as a monitor, screen, or the like, and can include a printer. In some embodiments, the display is optional. In some embodiments, the display 956 may be integrated into a single unit with the computing device 950, such as a tablet, smart phone, or smart watch. In at least some embodiments, the display is not local to the user. The input device 958 can be, for example, a keyboard, mouse, touch screen, track ball, joystick, voice recognition system, or any combination thereof, or the like. In at least some embodiments, the input device is not local to the user.

The optional magnetic field generator(s) 962 can be, for example, Helmholtz coils, solenoid coils, planar coils, saddle coils, electromagnets, shaking coils, permanent magnets, or any other suitable arrangement for generating a magnetic field. As an example, the magnetic field generator 962 can include three orthogonal sets of coils to generate magnetic fields along three orthogonal axes. Other coil arrangement can also be used. The optional sensor(s) 964 can include, but are not limited to, one or more magnetic field sensors, position sensors, orientation sensors, accelerometers, image recorders, or the like or any combination thereof.

The one or more magnetometers 960 can be any suitable magnetometer including, but not limited to, any suitable optically pumped magnetometer. In at least some embodiments, at least one of the one or more magnetometers (or all of the magnetometers) of the system is arranged for operation in the SERF mode. In at least some embodiments, at least one of the one or more magnetometers (or all of the magnetometers) of the system is arranged for operation in the scalar or non-SERF vector mode. Alternatively or additionally, the one or more magnetometers 960 of the system include at least one scalar or non-SERF vector mode magnetometer and at least one SERF mode magnetometer. Examples of dual mode systems are disclosed in U.S. Non-Provisional patent application Ser. No. 16/213,980, incorporated herein by reference in its entirety.

Figure 9B:
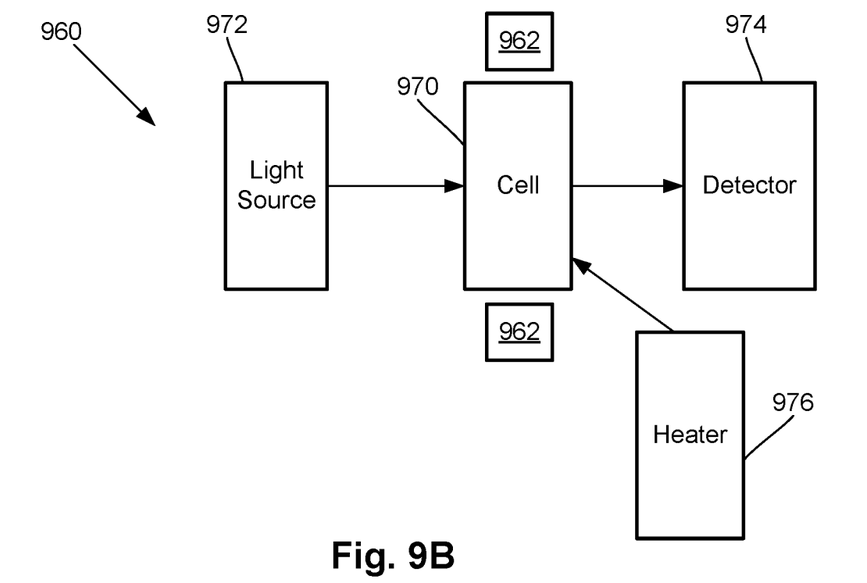
FIG. 9B is a schematic block diagram of one embodiment of a magnetometer, according to the invention.

FIG. 9B is a schematic block diagram of one embodiment of a magnetometer 960 which includes an alkali metal gas cell 970 (also referred to as a "cell" or "vapor cell"); a heating device 976 to heat the cell 970; a light source 972; and a detector 974. In addition, coils of a magnetic field generator 962 can be positioned around the vapor cell 970. The gas cell 970 can include, for example, an alkali metal vapor (for example, rubidium in natural abundance, isotopically enriched rubidium, potassium, or cesium, or any other suitable alkali metal such as lithium, sodium, or francium) and, optionally, one, or both, of a quenching gas (for example, nitrogen) and a buffer gas (for example, nitrogen, helium, neon, or argon). In some embodiments, the vapor cell may include the alkali metal atoms in a prevaporized form prior to heating to generate the vapor.

The light source 972 can include, for example, a laser to, respectively, optically pump the alkali metal atoms and probe the vapor cell. The light source 972 may also include optics (such as lenses, waveplates, collimators, polarizers, and objects with reflective surfaces) for beam shaping and polarization control and for directing the light from the light source to the cell and detector. Examples of suitable light sources include, but are not limited to, a diode laser (such as a vertical-cavity surface-emitting laser (VCSEL), distributed Bragg reflector laser (DBR), or distributed feedback laser (DFB)), light-emitting diode (LED), lamp, or any other suitable light source. In some embodiments, the light source 972 may include two light sources: a pump light source and a probe light source.

The detector 974 can include, for example, an optical detector to measure the optical properties of the transmitted light field amplitude, phase, or polarization, as quantified through optical absorption and dispersion curves, spectrum, or polarization or the like or any combination thereof. Examples of suitable detectors include, but are not limited to, a photodiode, charge coupled device (CCD) array, CMOS array, camera, photodiode array, single photon avalanche diode (SPAD) array, avalanche photodiode (APD) array, or any other suitable optical sensor array that can measure the change in transmitted light at the optical wavelengths of interest.

As described herein, a magnetic shield can be employed near or around OPM sensors to reduce relatively large magnetic fields, such as those associated the Earth's magnetic field, metal buildings, electronic and other equipment, and the like while not attenuating the magnetic signals of interest such as those generated by bio-magnetic mechanisms such as those arising in the heart or brain. In at least some embodiments, a shield for an OPM can be used using a high magnetic permeability material that exhibits a Barkhausen Effect energy threshold above the strength of the magnetic signals to be passed. Signals below the threshold are only slightly attenuated while magnetic signals above the threshold are highly attenuated.

In at least some embodiments, the OPM could be replaced by another magnetic sensor architecture. In at least some embodiments, a shielding solution for a magnetic field measurement system may include a combination of one or more conventional shields (for example, a mumetal shield) and amplitude-selective magnetic shielding (ASMS). In at least some embodiments, more than one material may be used in an ASMS. In at least some embodiments, the ASMS shielding factor could be different depending on the direction of the magnetic field.

In at least some embodiments, the combination of a high-sensitivity magnetometer with an amplitude-selective magnetic shielding (ASMS) can provide for the high sensitivity of detection without saturation of the signal due to the Earth's magnetic field. In at least some embodiments, the OPM sensor may be configured as either a magnetometer or a gradiometer to reject magnetic noise that is generated by the shield as it screens the Earth's magnetic field as well as common mode signals that enter the shield as they are below the cutoff response and reach each sensor equivalently. In at least some embodiments, materials such as Metglas™, can shield at least 90% of the Earth's magnetic field with a 25-micrometer thick layer without significantly reducing the strength of the magnetic signals of the brain. In at least some embodiments, the shield can be very light weight and integrated directly into the OPM sensor.

Instead of enclosing the human user in a magnetically shielded room, in at least some embodiments, only the OPM sensor and, at most, a local part of the user's body can be shielded. An example would be a shield shaped as a helmet, hood, beanie, or cap that is conformable and that would cover part of the user's head. Other similar shapes for the shield are also possible and adjustable to cover part of the user's head. Furthermore, in at least some embodiments, the shield is, or includes an amplitude selective magnetic shield (ASMS), so that small amplitude magnetic signals pass through while large amplitude magnetic signals are blocked. Examples of wearable conformable MEG systems that would cover part of the user's head are described in U.S.

Non-Provisional patent application Ser. No. 16/457,655 which is incorporated herein by reference in its entirety.

The above specification provides a description of the invention and its manufacture and use. Since many embodiments of the invention can be made without departing from the spirit and scope of the invention, the invention also resides in the claims hereinafter appended.

What is claimed as new and desired to be protected by Letters Patent of the United States is:

1. A wearable assembly, comprising:
   at least one magnetometer; and
   a shield disposed around the at least one magnetometer, wherein the shield comprises a first portion, wherein the first portion is configured to provide a shielding factor of at least 10 for a magnetic field having a magnetic field amplitude of 10 µT and to provide a shielding factor of no more than 2 for a magnetic field having a magnetic field amplitude of 1 nT.

2. The wearable assembly of claim 1, wherein an entirety of the shield is configured to provide a shielding factor of at least 10 for a magnetic field having a magnetic field amplitude of 10 µT and to provide a shielding factor of no more than 2 for a magnetic field having a magnetic field amplitude of 1 nT.

3. The wearable assembly of claim 1, wherein the shield comprises a second portion configured to provide a shielding factor of at least 10 for a magnetic field having a magnetic field amplitude of 1 nT.

4. The wearable assembly of claim 3, wherein the second portion is made of mumetal.

5. The wearable assembly of claim 3, wherein the first portion is a first layer and the second portion is a second layer disposed over or under the first layer.

6. The wearable assembly of claim 3, wherein the second portion overlaps only part, which is less than an entirety, of the first portion.

7. The wearable assembly of claim 1, wherein the first portion is made of an amorphous alloy comprising cobalt and iron and further comprising at least one of molybdenum, boron, silicon, or nickel.

8. A magnetic field measurement system for measurement of weak magnetic field signals, comprising:
   the wearable assembly of claim 1, wherein the first portion of the shield is configured for positioning between the at least one magnetometer and a source of the weak magnetic field signals.

9. A magnetic field measurement system for measurement of weak magnetic field signals, comprising:
   at least one magnetometer; and
   a shield disposed around the at least one magnetometer, wherein the shield comprises a first portion configured for positioning between the at least one magnetometer and a source of the weak magnetic field signals, wherein the first portion is configured to provide attenuation of a magnetic field having a magnetic field amplitude of 10 µT by at least 90% and to provide attenuation of a magnetic field having a magnetic field amplitude of 1 nT by no more than 50%.

10. The magnetic field measurement system of claim 9, wherein an entirety of the shield is configured to provide attenuation of a magnetic field having a magnetic field amplitude of 10 µT by at least 90% and to provide attenuation of a magnetic field having a magnetic field amplitude of 1 nT by no more than 50%.

11. The magnetic field measurement system of claim 9, wherein the shield comprises a second portion configured to provide attenuation of a magnetic field having a magnetic field amplitude of 1 nT by at least 90%.

12. The magnetic field measurement system of claim 11, wherein the second portion is made of mumetal.

13. The magnetic field measurement system of claim 11, wherein the first portion is a first layer and the second portion is a second layer disposed over or under the first layer.

14. The magnetic field measurement system of claim 11, wherein the second portion overlaps only part, which is less than an entirety, of the first portion.

15. The magnetic field measurement system of claim 11, wherein the first portion is made of an amorphous alloy comprising cobalt and iron and further comprising at least one of molybdenum, boron, silicon, or nickel.

16. A magnetic field measurement system for measurement of weak magnetic field signals, comprising:
    at least one magnetometer; and
    a shield disposed around the at least one magnetometer, wherein the shield comprises a first portion configured for positioning between the at least one magnetometer and a source of the weak magnetic field signals, wherein the first portion is made of an amorphous alloy comprising cobalt and iron which preferentially passes magnetic fields having a magnetic field amplitude of 500 nT or less.

17. The magnetic field measurement system of claim 16, wherein the first portion of the shield is configured to provide attenuation of a magnetic field having a magnetic field amplitude of 10 µT by at least 90% and to provide attenuation of a magnetic field having a magnetic field amplitude of 1 nT by no more than 50%.

18. The magnetic field measurement system of claim 16, wherein the first portion of the shield is configured to provide a shielding factor of at least 10 for a magnetic field having a magnetic field amplitude of 10 µT and to provide a shielding factor of no more than 2 for a magnetic field having a magnetic field amplitude of 1 nT.

19. The magnetic field measurement system of claim 18, wherein the shield further comprises a second portion configured to provide a shielding factor of at least 10 for a magnetic field having a magnetic field amplitude of 1 nT.

20. The magnetic field measurement system of claim 19, wherein the second portion overlaps only part, which is less than an entirety, of the first portion.

* * * * *